(12) United States Patent
Zhuang et al.

(10) Patent No.: US 10,289,246 B2
(45) Date of Patent: May 14, 2019

(54) INTEGRATED TOUCH-CONTROL DISPLAY PANEL AND TOUCH-CONTROL DISPLAY DEVICE

(71) Applicants: Xiamen Tianma Micro-electronics Co., Ltd., Xiamen (CN); Tianma Micro-electronics Co., Ltd., Shenzhen (CN)

(72) Inventors: Zhilong Zhuang, Xiamen (CN); Jiancai Huang, Xiamen (CN); Yumin Xu, Xiamen (CN)

(73) Assignees: Xiamen Tianma Micro-electronics Co., Ltd., Xiamen (CN); Tianma Micro-electronics Co., Ltd., Shenzhen (CN)

( * ) Notice: Subject to any disclaimer, the term of this patent is extended or adjusted under 35 U.S.C. 154(b) by 144 days.

(21) Appl. No.: 15/358,884

(22) Filed: Nov. 22, 2016

(65) Prior Publication Data

US 2017/0075498 A1 Mar. 16, 2017

(30) Foreign Application Priority Data

Jul. 29, 2016 (CN) .......................... 2016 1 0616775

(51) Int. Cl.
   *G06F 3/041* (2006.01)
   *G06F 3/044* (2006.01)
   *H01L 27/12* (2006.01)

(52) U.S. Cl.
   CPC ............ *G06F 3/0418* (2013.01); *G06F 3/044* (2013.01); *G06F 3/0412* (2013.01); *H01L 27/1214* (2013.01); *G06F 2203/04107* (2013.01)

(58) Field of Classification Search
   CPC ....... G06F 3/0418; G06F 3/0412; G06F 3/044
   See application file for complete search history.

(56) References Cited

U.S. PATENT DOCUMENTS

| 2010/0052700 A1* | 3/2010 | Yano | ........................ G06F 3/044 |
| | | | 324/658 |
| 2010/0110038 A1* | 5/2010 | Mo | .......................... G06F 3/044 |
| | | | 345/174 |

(Continued)

FOREIGN PATENT DOCUMENTS

| CN | 101393502 A | 3/2009 |
| CN | 102841716 A | 12/2012 |

(Continued)

*Primary Examiner* — Kevin M Nguyen
(74) *Attorney, Agent, or Firm* — Anova Law Group, PLLC (57) ABSTRACT

The present disclosure provides an integrated touch-control display panel and a touch-control display device. The integrated touch-control display panel includes a first substrate and a second substrate arranged opposite to the first substrate. The first substrate and the second substrate each includes a display region and a non-display region surrounding the display region. In the display region, a plurality of touch-control driving electrodes extending along the first direction and sequentially arranged along the second direction are disposed on the first substrate, and a plurality of touch-control sensing electrodes extending along the second direction and sequentially arranged along the first direction are disposed on the second substrate. The first direction is perpendicular to the second direction. A shielding structure is disposed between two adjacent touch-control driving electrodes. The shielding structure includes a plurality of first shielding electrodes extending along the first direction and arranged along the second direction.

20 Claims, 7 Drawing Sheets

(56) References Cited

U.S. PATENT DOCUMENTS

2013/0181943 A1* 7/2013 Bulea ................ G06F 3/044
 345/174
2014/0340354 A1* 11/2014 Liu .................... G06F 3/044
 345/174
2015/0268795 A1* 9/2015 Kurasawa ........... G06F 3/0418
 345/174

FOREIGN PATENT DOCUMENTS

| CN | 104169850 A | 11/2014 |
| CN | 105045446 A | 11/2015 |
| TW | 201443753 A | 11/2014 |

* cited by examiner

INTEGRATED TOUCH-CONTROL DISPLAY PANEL AND TOUCH-CONTROL DISPLAY DEVICE

CROSS-REFERENCES TO RELATED APPLICATIONS

This application claims priority of Chinese Patent Application No. 201610616775.0, filed on Jul. 29, 2016, the entire contents of which are hereby incorporated by reference.

FIELD OF THE INVENTION

The present disclosure generally relates to the field of display technology and, more particularly, relates to an integrated touch-control display panel and a touch-control display device.

BACKGROUND

With the development of display technologies, more and more display panels are integrated with the touch-control function, thus bringing convenience to users when using related applications.

Currently, to reduce the thickness of display panels and realize the touch-control function, a touch-control structure is often integrated into the display panel. For example, in current hybrid in-cell type mutual-capacitive touch-control structures, touch-control driving electrodes (TX electrodes) are disposed on an inner side of the array substrate (TFT substrate), and touch-control sensing electrodes (RX electrodes) are disposed on an outer side of the color film substrate (CF substrate). In particular, common electrodes (Vcom) of the display panel are divided into a plurality of stripe-shaped sub-electrodes extending along the direction of data lines and are arranged in parallel along the direction of gate lines. The common electrodes are multiplexed as touch-control driving electrodes. Further, the touch-control sensing electrodes include a plurality of stripe-shaped sub-electrodes arranged in parallel along a direction perpendicular to the arrangement direction of the touch-control driving electrodes.

However, under such arrangements, signal interference often exists between adjacent touch-control driving electrodes, thus reducing the signal-to-noise ratio and affecting the touch-control precision. The disclosed integrated touch-control display panel, and touch-control display device are directed to solve one or more problems set forth above and other problems.

BRIEF SUMMARY OF THE DISCLOSURE

One aspect of the present disclosure provides an integrated touch-control display panel including a first substrate and a second substrate arranged opposite to the first substrate. The first substrate and the second substrate each includes a display region and a non-display region surrounding the display region. In the display region, a plurality of touch-control driving electrodes extending along the first direction and sequentially arranged along the second direction are disposed on the first substrate, and a plurality of touch-control sensing electrodes extending along the second direction and sequentially arranged along the first direction are disposed on the second substrate. The first direction is perpendicular to the second direction. A shielding structure is disposed on the first substrate. The shielding structure includes a plurality of first shielding electrodes extending along the first direction and arranged along the second direction. The plurality of the first shielding electrodes are disposed between two adjacent touch-control driving electrodes.

Another aspect of the present disclosure provides a touch-control display device. The touch-control display device includes an integrated touch-control display panel, and the integrated touch-control display panel includes a first substrate and a second substrate arranged opposite to the first substrate. The first substrate and the second substrate each includes a display region and a non-display region surrounding the display region. In the display region, a plurality of touch-control driving electrodes extending along the first direction and sequentially arranged along the second direction are disposed on the first substrate, and a plurality of touch-control sensing electrodes extending along the second direction and sequentially arranged along the first direction are disposed on the second substrate. The first direction is perpendicular to the second direction. A shielding structure is disposed on the first substrate. The shielding structure includes a plurality of first shielding electrodes extending along the first direction and arranged along the second direction. The plurality of the first shielding electrodes are disposed between two adjacent touch-control driving electrodes.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The present disclosure will now be described in more details hereinafter with reference to the accompanying drawings that show various embodiments. Those skilled in the art can appreciate that alterations to structures, methods or functions derived from those embodiments all fall within the scope of the present disclosure. Exemplary embodiments, however, can be embodied in many different forms and should not be construed as being limited to the embodiments set forth herein. Like reference numerals in the drawings denote like elements throughout, and thus their descriptions will be omitted.

The described features, structures, or characteristics may be combined in any suitable manner in one or more embodiments. In the following descriptions, numerous specific details are provided to illustrate embodiments of the present disclosure. Those skilled in the art can recognize that the various embodiments of the present disclosure can be practiced without one or more of the specific details, or with other methods, components, materials, and so forth. In other instances, well-known structures, materials, or operations are not shown or described in detail to avoid obscuring aspects of the present disclosure.

As discussed above, in the existing hybrid in-cell type mutual-capacitive touch-control structures, signal interference often exists between adjacent touch-control driving electrodes, thus reducing the signal-to-noise ratio and affecting the touch-control precision.

The present disclosure provides an improved integrated touch-control display panel and a touch-control display panel. In the disclosed integrated touch-control display panel and touch-control display device, signal interference and coupling interference between any two adjacent touch-control driving electrodes may be reduced, thus avoiding poor touch-control and improving signal-to-noise ratio as well as touch-control precision.

Figure 1:
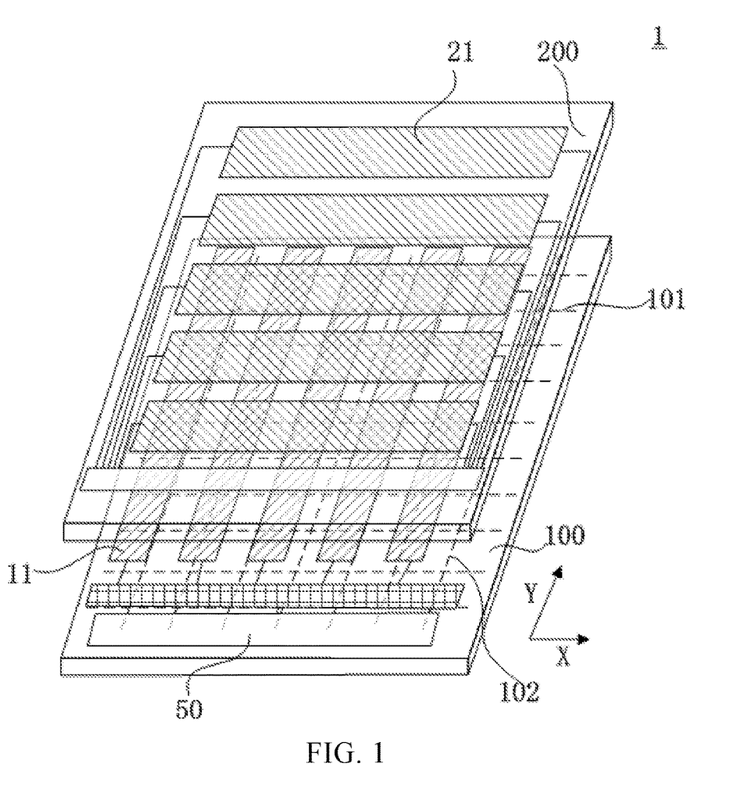
FIG. 1 illustrates an exemplary integrated touch-control display panel consistent with disclosed embodiments.

FIG. 1 illustrates an exemplary integrated touch-control display panel consistent with disclosed embodiments. As shown in FIG. 1, an integrated touch-control display panel 1 may include an array substrate 100, and a color film substrate 200 arranged opposite to the array substrate 100. The array substrate 100 and the color film substrate 200 may each include a display region and a non-display region surrounding the display region.

Referring to FIG. 1, the display region and the non-display region are not particularly shown. In certain embodiments, a central area where electrodes intersect with each other (i.e., an electrode region) may correspond to the display region, and an area surrounding the display region may correspond to the non-display region. Lead lines and circuitry shown in FIG. 1 may be disposed in the non-display region.

As shown in FIG. 1, in the display region, a plurality of touch-control driving electrodes 11 may be disposed on the array substrate 100, and the plurality of touch-control driving electrodes 11 may extend along a first direction (a Y direction, as shown in FIG. 1) and may be sequentially arranged along a second direction (an X direction, as shown in FIG. 1). In the non-display region, a driving integrated circuit 50 may be disposed on the array substrate 100. The touch-control driving electrodes 11 may be connected to the driving integrated circuit 50, for example, via wires.

As shown in FIG. 1, in the display region, a plurality of touch-control sensing electrodes 21 may be disposed on the color film substrate 200, and the plurality of touch-control sensing electrodes 21 may extend along the second direction X and may be sequentially arranged along the first direction Y.

The first direction Y may intersect with the second direction X. In one embodiment, the first direction Y may be perpendicular to the second direction X.

In one embodiment, the first direction Y may be an extension direction of data lines 102 disposed on the array substrate 100, and the second direction X may be an extension direction of gate lines 101 disposed on the array substrate.

In one embodiment, as shown in FIG. 1, the touch-control driving electrodes 11 may be disposed on one side of the array substrate 100 facing towards the color film substrate 200, and the touch-control sensing electrodes 21 may be disposed on one side of the color film substrate 200 facing away the array substrate 100.

Figure 2:
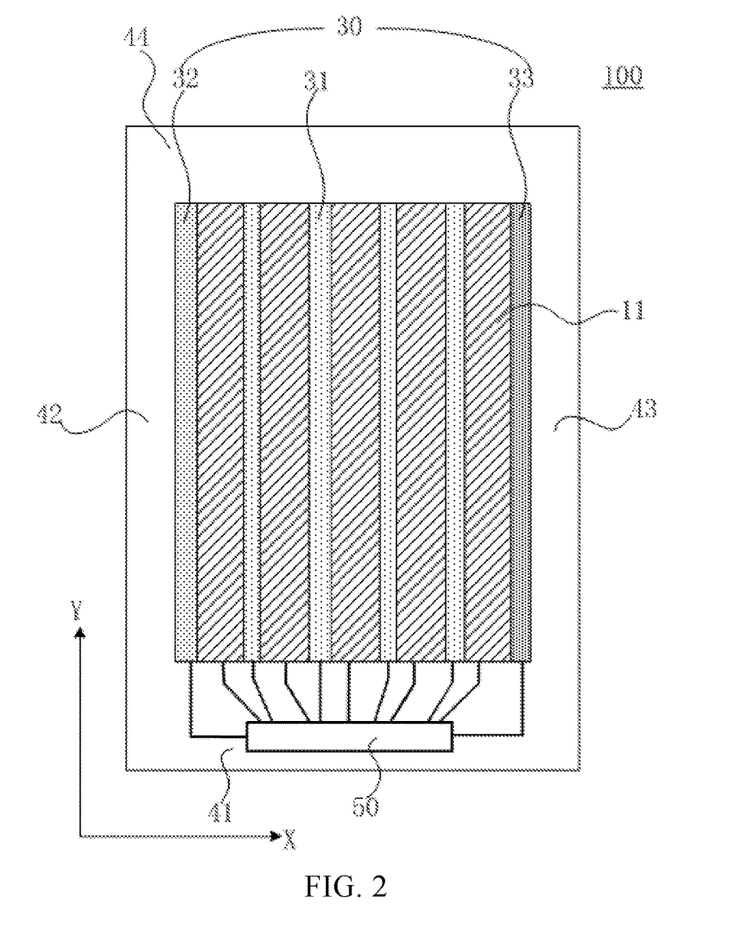
FIG. 2 illustrates a top view of an array substrate in an exemplary integrated touch-control display panel consistent with disclosed embodiments.

FIG. 2 illustrates a top view of an array substrate in an exemplary integrated touch-control display panel consistent with disclosed embodiments. As shown in FIG. 2, a shielding structure 30 may be disposed on the array substrate 100. The shielding structure 30 may include a plurality of first shielding electrodes 31 extending along the first direction Y and arranged along the second direction X. The first shielding electrodes 31 may be disposed between two adjacent touch-control driving electrodes 11.

The shielding structure 30 having the plurality of first shielding electrodes 31 may shield signal interference and coupling interference between any two adjacent touch-control driving electrodes 11, thus avoiding poor touch control and improving signal-to-noise ratio as well as touch-control precision.

In one embodiment, as shown in FIG. 2, the non-display region in the array substrate 100 may include a first non-display region 41, a second non-display region 42, a third non-display region 43, and a fourth non-display region 44. The first non-display region 41 and fourth non-display region 44 may be disposed opposite to each other in the first direction Y. The second non-display region 42 and the third non-display region 43 may be disposed opposite to each other in the second direction X. In particular, the driving integrated circuit 50 may be disposed in the first non-display region 41.

In one embodiment, as shown in FIG. 2, the shielding structure 30 may also include a second shielding electrode 32 disposed between the second non-display region 42 and the touch-control driving electrode 11 (i.e., the leftmost touch-control driving electrode 11 in FIG. 2) adjacent to the second non-display region 42. The second shielding electrode 32 may extend along the first direction Y. Further, the second shielding electrode 32 may shield signal interference of the second non-display region 42 (e.g., lead lines) to the adjacent touch-control driving electrode 11, thus avoiding poor touch control and improving the signal-to-noise ratio.

In one embodiment, as shown in FIG. 2, the shielding structure 30 may also include a third shielding electrode 33 disposed between the third non-display region 43 and the touch-control driving electrode 11 (i.e., the rightmost touch-control driving electrode 11 in FIG. 2) adjacent to the third non-display region 43. The third shielding electrode 33 may extend along the first direction Y. Further, the second shielding electrode 32 may shield signal interference of the third non-display region 43 (e.g., lead lines) to the adjacent touch-control driving electrode 11, thus avoiding poor touch control and improving signal-to-noise ratio.

In one embodiment, as shown in FIG. 2, the shielding structure 30, the touch-control driving electrodes 11, and corresponding wires may be disposed on a same layer, namely, a same layer on the array substrate 100.

In one embodiment, the shielding structure 30 and the touch-control driving electrodes 11 may be connected to the driving integrated circuit 50 via corresponding wires, respectively. Specifically, as shown in FIG. 2, each first shielding electrode 31, the second shielding electrode 32, and the third shielding electrode 33 may be individually connected to the driving integrated circuit 50, for example, via one wire. Each touch-control driving electrode 11 may also be individually connected to the driving integrated circuit 50, for example, via one wire.

In one embodiment, a display frame may include a plurality of touch-control operation stages and a plurality of display stages. In one embodiment, during each touch-control operation stage, the driving integrated circuit 50 may supply a touch-control driving signal to the touch-control driving electrodes 11. Further, the shielding structure 30 may be electrically floating. That is, the shielding structure 30 may not be actively driven by any pull-up or pull-down circuits and are not connected to one another.

In one embodiment, during each display stage, the touch-control driving electrodes 11 may be multiplexed as common electrodes (Vcom), and the driving integrated circuit 50 may supply a common voltage signal to the common electrodes (Vcom). Further, the data lines 102 may be configured to transmit a data signal to a plurality of pixel units (not shown) disposed on the array substrate to display a desired color. The plurality of pixel units may be defined by the intersected gate lines 101 and data lines 102.

Figure 3:
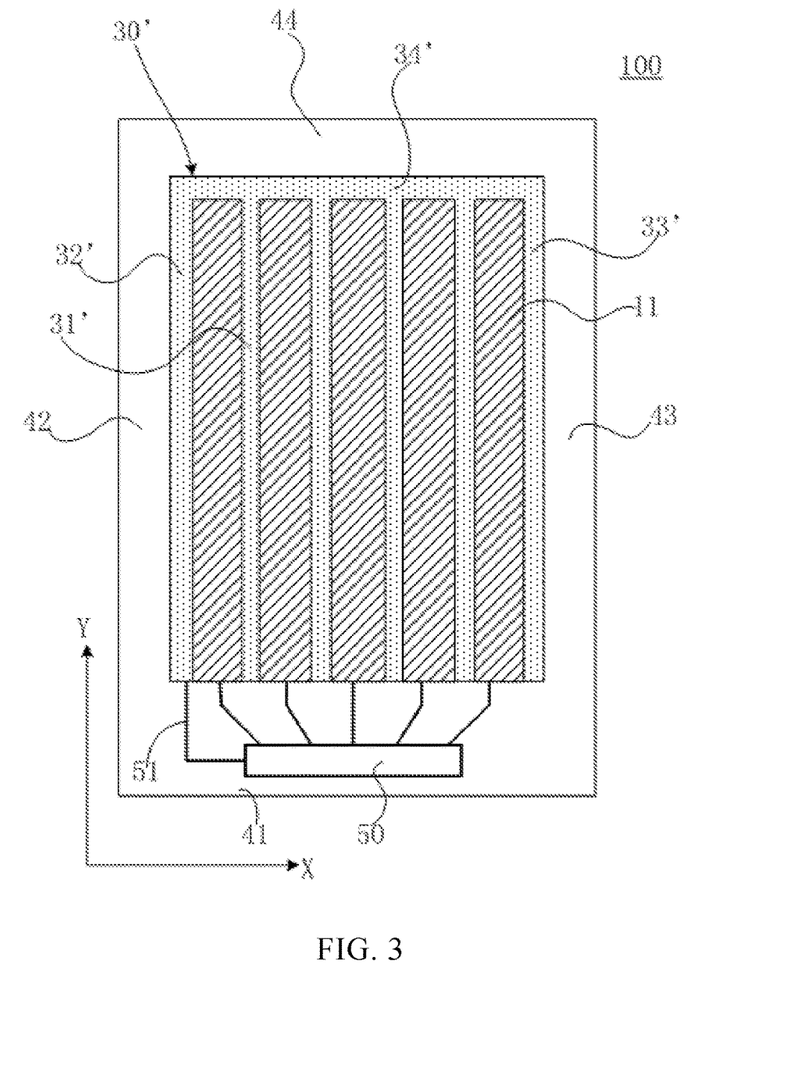
FIG. 3 illustrates a top view of another array substrate in an exemplary integrated touch-control display panel consistent with disclosed embodiments.

Different from the array substrate in FIG. 2, FIG. 3 illustrates another array substrate in an exemplary integrated touch-control display panel including a shielding structure 30'. Other than the shielding structure 30', components in the integrated touch-control display panel in FIG. 3 may all be the same as the corresponding components in FIG. 2.

As shown in FIG. 3, the disclosed shielding structure 30' may include a plurality of first shielding electrodes 31', a second shielding electrode 32', and a third shielding electrode 33'. The plurality of first shielding electrodes 31' may be disposed between two adjacent touch-control driving electrodes. The second shielding electrode 32' may be disposed between the second non-display region 42 and the touch-control driving electrode 11 (the leftmost touch-control driving electrode 11) adjacent to the second non-display region 42. The third shielding electrode 33' may be disposed between the third non-display region 43 and the touch-control driving electrode 11 (the rightmost touch-control driving electrode 11) adjacent to the third non-display region 43. The first shielding electrodes 31', the second shielding electrode 32', and the third shielding electrode 33' in FIG. 3 may be the same as the first shielding electrodes 31, the second shielding electrode 32, and the third shielding electrode 33 in FIG. 2, respectively.

As shown in FIG. 3, the shielding structure 30' may also include a fourth shielding electrode 34'. The fourth shielding electrode 34' may be disposed between the fourth non-display region 44 and the touch-control driving electrodes 11, and extend along the second direction X. The fourth shielding electrode 34' may be connected to each first shielding electrode 31', the second shielding electrode 32' and/or the third shielding electrode 33', thus forming a comb-like shielding structure 30'.

In one embodiment, the fourth shielding electrode 34' may better shield signal interference of the fourth non-display region 44 (e.g., lead lines) to the touch-control driving electrodes 11, thus avoiding poor touch control and improving the signal-to-noise ratio.

Optionally, in one embodiment, as shown in FIG. 3, the fourth shielding electrode 34' may be connected to each first shielding electrode 31', the second shielding electrode 32', and the third shielding electrode 33', thus forming a one-piece comb-like shielding structure 30'. That is, the fourth shielding electrode 34' may show no breakpoint. Further, the fourth shielding electrode 34' may be integratedly connected to each first shielding electrode 31', the second shielding electrode 32', and the third shielding electrode 33', thus forming the one-piece (or, whole-piece) comb-like shielding structure 30'.

In the present disclosure, the one-piece comb-like shielding structure 30' may also be called a 'one-piece comb-like electrode'. Optionally, in one embodiment, as shown in FIG. 3, the one-piece comb-like shielding structure 30' may be connected to the driving integrated circuit 50 via a wire 51.

In one embodiment, as shown in FIG. 3, the shielding structure 30', the touch-control driving electrodes 11, and corresponding wires may be disposed on the same layer. That is, the shielding structure 30', the touch-control driving electrodes 11, and corresponding wires may be formed on the same layer on the array substrate 100.

In one embodiment, a display frame may include a plurality of touch-control operation stages and a plurality of display stages. In one embodiment, during the touch-control operation stage, the shielding structure 30' may be electrically floating. That is, the shielding structure 30' may not be actively driven by any pull-up or pull-down circuits and are not connected to one another. In one embodiment, during the display stage, the touch-control driving electrodes may be multiplexed as common electrodes (Vcom), and the driving integrated circuit 50 may supply a common voltage signal to the common electrodes (Vcom).

In one embodiment, in a 'gesture-to-wake' mode, the one-piece comb-like shielding structure 30' may be configured to receive touch-control driving signals, and the touch-control driving electrodes 11 may be electrically floating. That is, the touch-control driving electrodes 11 may not be actively driven by any pull-up or pull-down circuits and are not connected to one another.

By using such a configuration, when the integrated touch-control display panel is in the 'gesture-to-wake' mode, the touch-control driving electrodes 11 (i.e., a touch-control driving electrode layer including a plurality of touch-control driving electrodes 11) may no longer need to receive the touch-control driving signals. That is, as the 'one-piece comb-like electrode', the one-piece comb-like shielding structure 30' may replace the touch-control driving electrode layer to receive the touch-control driving signals, thus detecting touch gestures. Specifically, after receiving the touch-control driving signals from the driving integrated circuit 50, the one-piece comb-like electrode 30' may output signals at a low report rate. The touch-control sensing electrodes 21 may sense a capacitance change and output a signal concerning capacitance change to the driving integrated circuit 50. By then, the 'gesture-to-wake' may support a single-tap or a double-tap wake-up motion in any location within the display region.

When in a standby stage of the 'gesture-to-wake' mode, the touch-control driving electrodes 11 may not need to be operative, as long as the one-piece comb-like electrode 30' receives the touch-control driving signals and works at a relatively low scanning frequency. That is, compared to existing integrated touch-control display panels, sequential scanning of the touch-control driving electrodes 11 may no longer needed. Accordingly, power consumption may be greatly reduced.

In one embodiment, if the integrated touch-control display panel is configured to support graphic-based motion wake-up, once the one-piece comb-like electrode 30' detects the touch-control driving signal, the integrated touch-control display panel may immediately be switched from the standby stage to a normal touch-control display stage (including the touch-control operation stage). That is, the one-piece comb-like electrode 30' (the shielding structure 30') may be electrically floating, and the plurality of touch-control driving electrodes 11 and the plurality of touch-control sensing electrodes 21 may together form an electrode matrix. The touch-control driving electrodes 11 may be configured to receive the touch-control driving signals from the driving integrated circuit 50, and output signals to the touch-control sensing electrodes 21, thus detecting the graphic-based motion.

Figure 4:
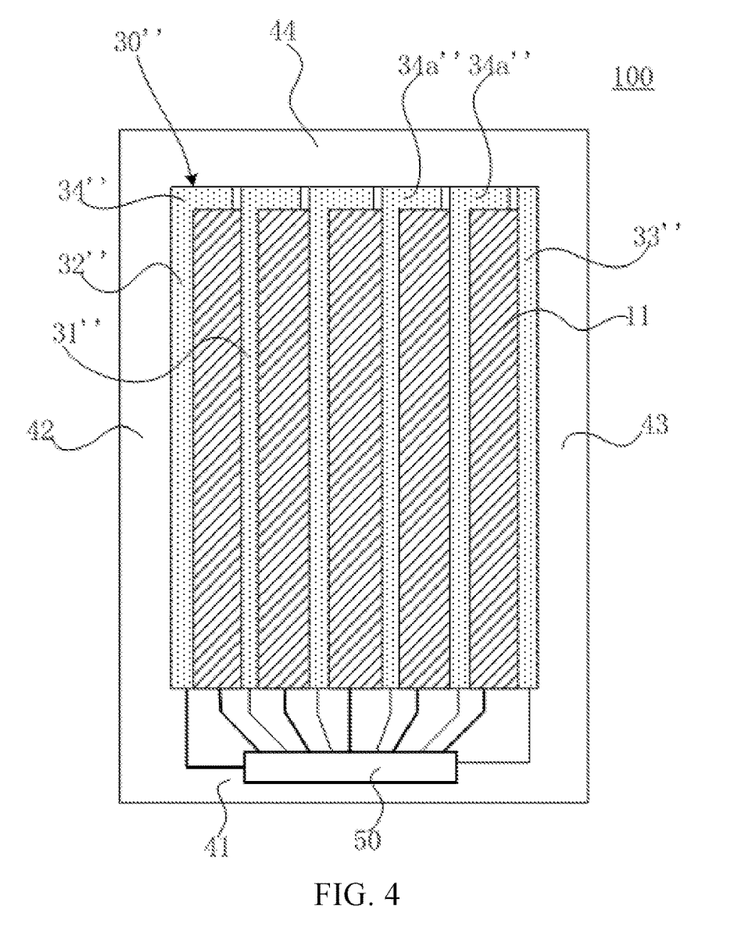
FIG. 4 illustrates a top view of another array substrate in an exemplary integrated touch-control display panel consistent with disclosed embodiments.

Different from the integrated touch-control display panel in FIG. 3, FIG. 4 illustrates another array substrate in an exemplary integrated touch-control display panel including a shielding structure 30".

As shown in FIG. 4, in the disclosed shielding structure 30", one or a plurality of breakpoints (not labeled) may be configured on a fourth shielding electrode 34". Optionally, in one embodiment, a plurality of breakpoints sequentially corresponding to each touch-control driving electrode 11 may be configured on the fourth shielding electrode 34". Accordingly, the fourth shielding electrode 34" may be divided into a plurality of fourth shielding sub-electrodes 34a" by the plurality of breakpoints.

As shown in FIG. 4, the fourth shielding sub-electrodes 34a" may be sequentially connected to one adjacent first shielding electrode 31" to form a " Γ " shaped electrode structure. Specifically, a left endpoint of each fourth shielding sub-electrode 34a" may be connected to the adjacent first shielding electrode 31" on the left side to form the " Γ " shaped electrode structure, and a right endpoint of each fourth shielding sub-electrode 34a" may be disconnected to the adjacent first shielding electrode 31" on the right side. That is, the location of each breakpoint may sequentially correspond to an approximately right-side edge of a corresponding touch-control driving electrode 11.

Optionally, as shown in FIG. 4, the leftmost fourth shielding sub-electrode 34a" may be connected to a second shielding electrode 32" to form a " Γ " shaped electrode structure, and the rightmost fourth shielding sub-electrode 34a" may be connected to the third shielding electrode 33" to form a stripe-shaped electrode structure.

In one embodiment, as shown in FIG. 4, each " Γ " shaped electrode structure, and the rightmost stripe-shaped electrode structure may be individually connected to the driving integrated circuit 50, for example, via one wire.

Figure 5:
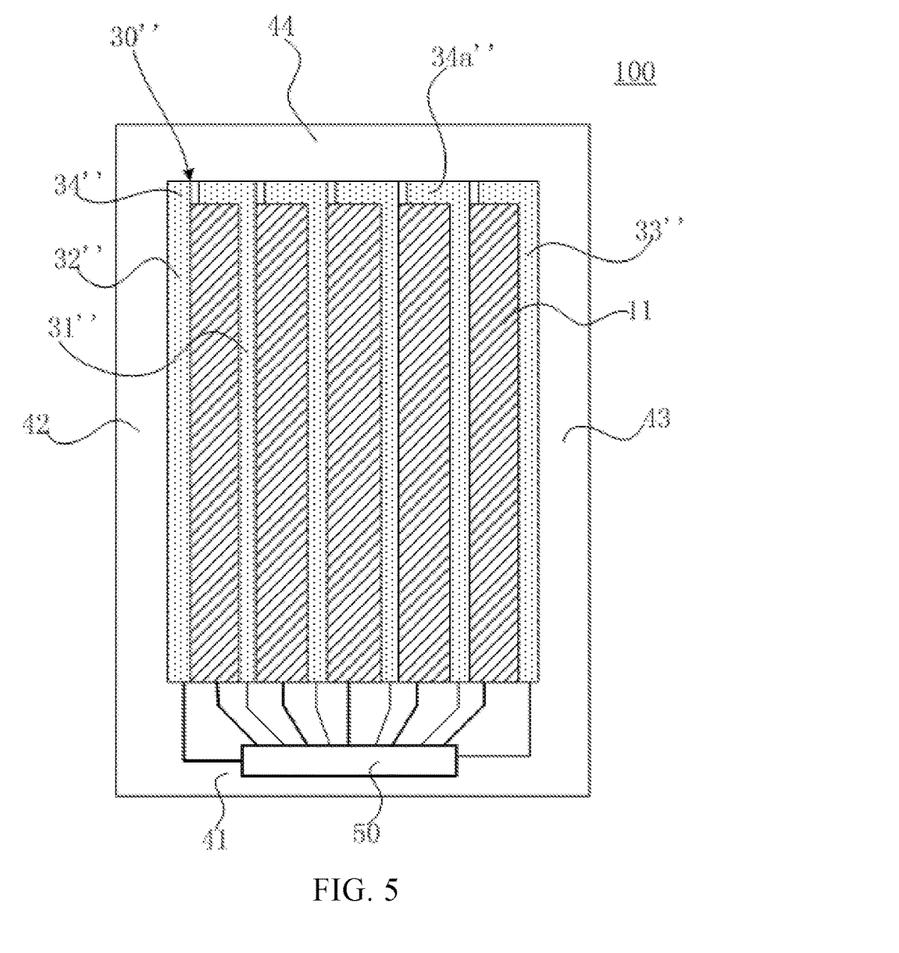
FIG. 5 illustrates a top view of another array substrate in an exemplary integrated touch-control display panel consistent with disclosed embodiments.

In one embodiment, FIG. 5 illustrates another array substrate in an exemplary integrated touch-control display panel. As shown in FIG. 5, each fourth shielding sub-electrode 34a" may be sequentially connected to the adjacent first shielding electrode 31" on the right side to form a " ⅂ " shaped electrode structure. Specifically, a right endpoint of each fourth shielding sub-electrode 34a" may be connected to the adjacent first shielding electrode 31" on the right side to form the " ⅂ " shaped electrode structure, and a left endpoint of each fourth shielding sub-electrode 34a" may be disconnected to the adjacent first shielding electrode 31" on the left side. That is, the location of each breakpoint may sequentially correspond to an approximately left-side edge of a corresponding touch-control driving electrode 11.

Optionally, as shown in FIG. 5, the rightmost fourth shielding sub-electrode 34a" may be connected to the third shielding electrode 33" to form the " ⅂ " shaped electrode structure, and the leftmost fourth shielding sub-electrode 34a" may be connected to the second shielding electrode 32" to form a stripe-shaped electrode structure. Each " ⅂ " shaped electrode and the leftmost stripe-shaped electrode structure may be individually connected to the driving integrated circuit 50, for example via one wire.

Figure 6:
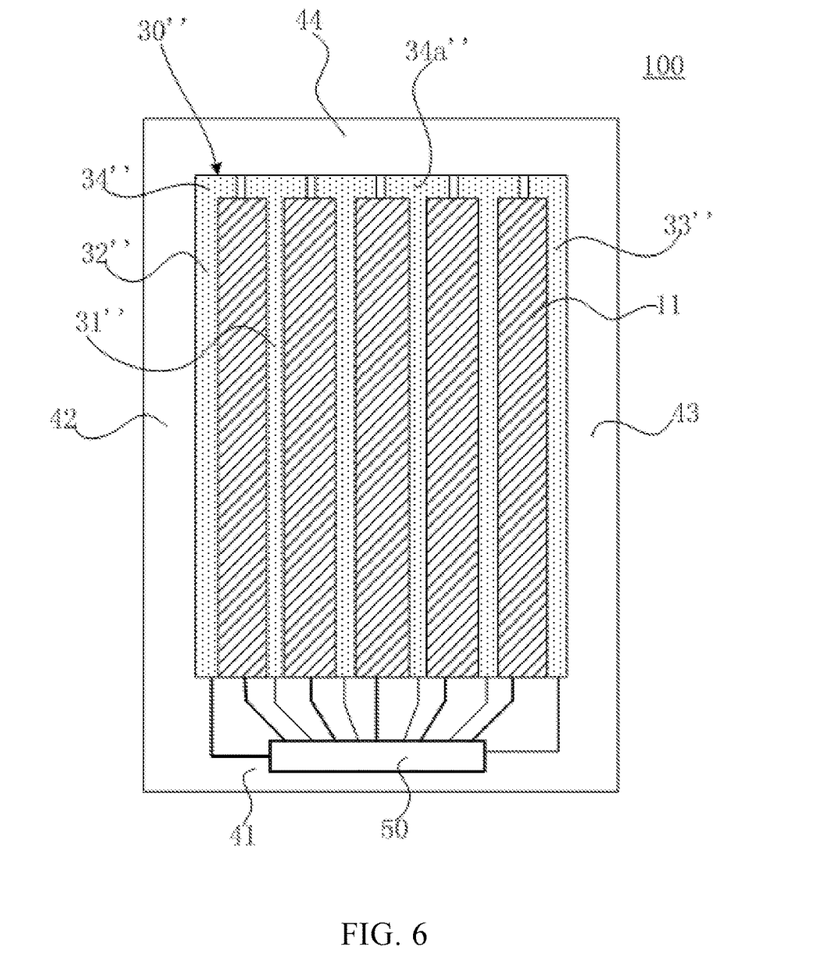
FIG. 6 illustrates a top view of another array substrate in an exemplary integrated touch-control display panel consistent with disclosed embodiments.

In one embodiment, FIG. 6 illustrates another array substrate in an exemplary integrated touch-control display panel. As shown in FIG. 6, locations of the plurality of breakpoints in the fourth shielding electrode 34" may sequentially correspond to a middle portion of each touch-control driving electrode 11. That is, each fourth shielding sub-electrode 34a" may be sequentially connected to one adjacent first shielding electrode 31" to form a " ┬ " shaped electrode structure. Under this condition, the leftmost fourth shielding sub-electrode 34a" may be connected to the second shielding electrode 32" to form a " Γ " shaped electrode structure. The rightmost fourth shielding sub-electrode 34a" may be connected to the third shielding electrode 33" to form a " ⅂ " shaped electrode structure.

Optionally, the leftmost fourth shielding sub-electrode 34a" may be connected to the second shielding electrode 32" to form a stripe-shaped electrode structure. Optionally, the rightmost fourth shielding sub-electrode 34a" may be connected to the third shielding electrode 33" to form a stripe-shaped electrode structure.

Each " ┬ " shaped electrode structure, the leftmost " Γ " shaped electrode structure, and the rightmost " ⅂ " shaped electrode structure may be individually connected to the driving integrated circuit 50, for example, via one wire.

In various above-described embodiments, the " Γ " shaped, " ⅂ " shaped, or " ┬ " shaped electrode structures individually disposed between two adjacent touch-control driving electrodes 11 in the shielding structure 30" may shield signal interference and coupling interference between any two adjacent touch-control driving electrodes 11, thus avoiding poor touch control and improving signal-to-noise ratio as well as touch-control precision. Further, the " Γ " shaped, " ⅂ " shaped, or " ┬ " shaped electrode structures individually disposed between two adjacent touch-control driving electrodes 11 in the shielding structure 30" may also shield signal interferences of the fourth non-display region 44 (e.g., lead lines, etc.) to the touch-control driving electrodes 11, thus avoiding poor touch control and improving signal-to-noise ratio.

Figure 7:
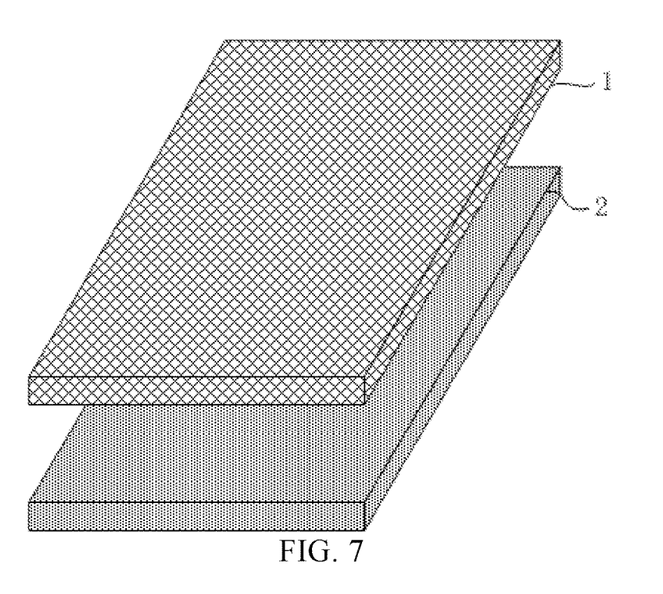
FIG. 7 illustrate an exemplary touch-control display device consistent with disclosed embodiments.

The disclosed integrated touch-control display panel may be applied in touch-control display devices such as cellphones, pads, etc. FIG. 7 illustrates an exemplary touch-control display device consistent with disclosed embodiments. Referring to FIG. 7, the touch-control display device may primarily include the integrated touch-control display panel 1 and a backlight module group 2.

It should be understood that, although the present disclosure is described in accordance with the embodiments, not every embodiment necessarily includes a single technical solution. The narrative way of the specification is merely for illustrative purpose, and those skilled in the art should read this specification as a whole. Technical solutions of various embodiments may be appropriately combined to form other embodiments as will be appreciated by those skilled in the art.

The above-mentioned descriptions represent merely the exemplary embodiments of the present disclosure, and are not intended to limit the scope of the present disclosure thereto. Without departing from the spirit of the present disclosure, various equivalent embodiments or alterations shall fall within the scope of the present disclosure.

What is claimed is:

1. An integrated touch-control display panel, comprising:
a first substrate; and
a second substrate arranged opposite to the first substrate, wherein:
the first substrate and the second substrate each includes a display region and a non-display region surrounding the display region,
a plurality of touch-control driving electrodes, extending along a first direction and sequentially arranged along a second direction, are disposed in the display region of the first substrate,
a plurality of touch-control sensing electrodes, extending along the second direction and sequentially arranged along the first direction, are disposed in the display region of the second substrate,
the first direction is perpendicular to the second direction,
a shielding structure is disposed on the first substrate, the shielding structure including a plurality of first shielding electrodes extending along the first direction and arranged along the second direction, wherein each first shielding electrode of the plurality of first shielding electrodes is disposed between two adjacent touch-control driving electrodes and individually connected to a driving integrated circuit,
the plurality of touch-control driving electrodes are connected to the driving integrated circuit, and
in a gesture-to-wake mode, the shielding structure receives touch-control driving signals through the plurality of first shielding electrodes, while the plurality of touch-control driving electrodes are floating without receiving the touch-control driving signals.

2. The integrated touch-control display panel according to claim 1, wherein:
the first substrate is an array substrate; and
the second substrate is a color film substrate.

3. The integrated touch-control display panel according to claim 2, wherein:
the non-display region of the array substrate includes a first non-display region and a fourth non-display region configured opposite to the first non-display region along the first direction, wherein the driving integrated circuit is disposed in the first non-display region;
the non-display region of the array substrate includes a second non-display region and a third non-display region configured opposite to the second non-display region along the second direction; and
the shielding structure further includes:
a second shielding electrode extending along the first direction and disposed between the second non-display region and a touch-control driving electrode of the plurality of touch-control driving electrodes adjacent to the second non-display region; and
a third shielding electrode extending along the first direction and disposed between the third non-display region and a touch-control driving electrode of the plurality of touch-control driving electrodes adjacent to the third non-display region.

4. The integrated touch-control display panel according to claim 3, wherein:
the shielding structure further comprises a fourth shielding electrode extending along the second direction, and disposed between the fourth non-display region and the plurality of touch-control driving electrodes,
wherein the fourth shielding electrode is connected to each first shielding electrode of the plurality of first shielding electrodes, and is connected to at least one of the second shielding electrode and the third shielding electrode, thereby forming a comb-like shielding structure.

5. The integrated touch-control display panel according to claim 4, wherein:
one or a plurality of breakpoints are configured in the fourth shielding electrode.

6. The integrated touch-control display panel according to claim 5, wherein:
the plurality of breakpoints configured in the fourth shielding electrode sequentially correspond to each touch-control driving electrode, thus the fourth shielding electrode is divided into a plurality of fourth shielding sub-electrodes by the breakpoints.

7. The integrated touch-control display panel according to claim 6, wherein:
the plurality of fourth shielding sub-electrodes are sequentially connected to one adjacent first shielding electrode to form a "Γ" shaped, "⅂" shaped, or "⊤" shaped electrode structure.

8. The integrated touch-control display panel according to claim 7, wherein:
each "Γ" shaped, "⅂" shaped, or "⊤" shaped electrode structure is connected to the driving integrated circuit via one wire.

9. The integrated touch-control display panel according to claim 4, wherein:
the fourth shielding electrode is connected to each first shielding electrode of the plurality of first shielding electrodes, the second shielding electrode, and the third shielding electrode, thereby forming a one-piece comb-like shielding structure.

10. The integrated touch-control display panel according to claim 9, wherein:
the one-piece comb-like shielding structure is connected to the driving integrated circuit via one wire.

11. The integrated touch-control display panel according to claim 9, wherein:
in the gesture-to-wake mode, the one-piece comb-like shielding structure receives touch-control driving signals through the plurality of first shielding electrodes while the plurality of touch-control driving electrodes are floating without receiving the touch-control driving signals.

12. The integrated touch-control display panel according to claim 1, wherein:
the shielding structure, the plurality of touch-control driving electrodes, and corresponding wires are disposed on a same layer.

13. The integrated touch-control display panel according to claim 1, wherein:
during a touch-control operation stage, the shielding structure is floating.

14. The integrated touch-control display panel according to claim 1, wherein:
during a display stage, the plurality of touch-control driving electrodes are multiplexed as common electrodes.

15. The integrated touch-control display panel according to claim 1, wherein:
the first direction is an extension direction of data lines of the integrated touch-control display panel; and
the second direction is an extension direction of gate lines of the integrated touch-control display panel.

16. The integrated touch-control display panel according to claim 2, wherein:
  the plurality of touch-control driving electrodes are disposed on one side of the array substrate facing towards the color film substrate; and
  the plurality of touch-control sensing electrodes are disposed on one side of the color film substrate facing away the array substrate.

17. A touch-control display device including an integrated touch-control display panel, wherein the integrated touch-control display panel comprises:
  a first substrate; and
  a second substrate arranged opposite to the first substrate, wherein:
    the first substrate and the second substrate each includes a display region and a non-display region surrounding the display region,
    a plurality of touch-control driving electrodes, extending along a first direction and sequentially arranged along a second direction, are disposed in the display region of the first substrate,
    a plurality of touch-control sensing electrodes, extending along the second direction and sequentially arranged along the first direction, are disposed in the display region of the second substrate,
    the first direction is perpendicular to the second direction,
    a shielding structure is disposed on the first substrate, the shielding structure including a plurality of first shielding electrodes extending along the first direction and arranged along the second direction, wherein each first shielding electrode of the plurality of first shielding electrodes is disposed between two adjacent touch-control driving electrodes and individually connected to a driving integrated circuit,
    the plurality of touch-control driving electrodes are connected to the driving integrated circuit, and
    in a gesture-to-wake mode, the shielding structure receives touch-control driving signals through the plurality of first shielding electrodes while the plurality of touch-control driving electrodes are floating without receiving the touch-control driving signals.

18. The touch-control display device according to claim 17, wherein:
  the first substrate is an array substrate; and
  the second substrate is a color film substrate.

19. The touch-control display device according to claim 18, wherein:
  the non-display region of the array substrate includes a first non-display region and a fourth non-display region configured opposite to the first non-display region along the first direction, wherein the driving integrated circuit is disposed in the first non-display region;
  the non-display region of the array substrate includes a second non-display region and a third non-display region configured opposite to the second non-display region along the second direction; and
  the shielding structure further includes:
    a second shielding electrode extending along the first direction and disposed between the second non-display region and a touch-control driving electrode of the plurality of touch-control driving electrodes adjacent to the second non-display region; and
    a third shielding electrode extending along the first direction and disposed between the third non-display region and a touch-control driving electrode of the plurality of touch-control driving electrodes adjacent to the third non-display region.

20. The touch-control display device according to claim 19, wherein:
  the shielding structure further comprises a fourth shielding electrode extending along the second direction, and disposed between the fourth non-display region and the plurality of touch-control driving electrodes,
  wherein the fourth shielding electrode is connected to each first shielding electrode of the plurality of first shielding electrodes, and is connected to at least one of the second shielding electrode and the third shielding electrode, thereby forming a comb-like shielding structure.

* * * * *